(12) United States Patent
Carcasi et al.

(10) Patent No.: US 11,738,363 B2
(45) Date of Patent: Aug. 29, 2023

(54) BATH SYSTEMS AND METHODS THEREOF

(71) Applicant: Tokyo Electron Limited, Tokyo (JP)

(72) Inventors: Michael Carcasi, Austin, TX (US);
Ihsan Simms, Austin, TX (US); Joel Estrella, Austin, TX (US); Antonio Luis Pacheco Rotondaro, Austin, TX (US); Joshua Hooge, Austin, TX (US); Hiroshi Marumoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/341,105

(22) Filed: Jun. 7, 2021

(65) Prior Publication Data
US 2022/0388022 A1 Dec. 8, 2022

(51) Int. Cl.
*B05C 11/10* (2006.01)
*H01L 21/311* (2006.01)
*H01L 21/02* (2006.01)
*B05D 1/18* (2006.01)
*B05C 3/04* (2006.01)
*B08B 3/10* (2006.01)

(52) U.S. Cl.
CPC ............ *B05C 3/04* (2013.01); *B05C 11/1002* (2013.01); *B08B 3/106* (2013.01); *H01L 21/0206* (2013.01); *H01L 21/31111* (2013.01); *B05D 1/18* (2013.01)

(58) Field of Classification Search
CPC ....... B05C 3/04; B05C 11/1002; B08B 3/106; H01L 21/31111; B05D 1/18
See application file for complete search history.

(56) References Cited

U.S. PATENT DOCUMENTS

| 4,647,172 A | 3/1987 | Batchelder et al. |
| 4,851,311 A | 7/1989 | Millis et al. |
| 5,089,305 A | 2/1992 | Ushijima et al. |
| 5,094,884 A | 3/1992 | Hillman et al. |
| 5,127,362 A | 7/1992 | Iwatsu et al. |
| 5,152,175 A * | 10/1992 | Reynolds ............... B03D 1/028 73/19.01 |
| 5,366,757 A | 11/1994 | Lin |
| 5,939,130 A | 8/1999 | Shiraishi et al. |

(Continued)

FOREIGN PATENT DOCUMENTS

| JP | H04262552 A | 9/1992 |
| JP | H09276775 A | 10/1997 |

(Continued)

OTHER PUBLICATIONS

Hayashi, WO-2016084927-A1, Machine Translation. (Year: 2022).*

(Continued)

*Primary Examiner* — Duy Vu N Deo
*Assistant Examiner* — Christopher Remavege
(74) *Attorney, Agent, or Firm* — Slater Matsil, LLP

(57) ABSTRACT

A method of processing a plurality of substrates includes immersing the plurality of substrates into a bath solution contained in a bath chamber; generating gas bubbles in the bath solution; projecting light from a light source toward the bath chamber; generating light sensor data by capturing light emanating off the bath chamber after interacting with the gas bubbles with a light sensor; and converting the light sensor data into a metric for the bath solution.

19 Claims, 15 Drawing Sheets

(56) References Cited

U.S. PATENT DOCUMENTS

| | | | |
|---|---|---|---|
| 5,985,357 A | 11/1999 | Sanada | |
| 6,248,175 B1 | 6/2001 | Subramanian et al. | |
| 6,319,317 B1 | 11/2001 | Takamori | |
| 6,376,013 B1 | 4/2002 | Rangarajan et al. | |
| 6,383,948 B1 | 5/2002 | Kitano et al. | |
| 6,493,078 B1 | 12/2002 | Fitzsimmons | |
| 6,642,155 B1 | 11/2003 | Whitman et al. | |
| 6,680,078 B2 | 1/2004 | Davlin et al. | |
| 6,686,602 B2 | 2/2004 | Some | |
| 6,693,708 B1 | 2/2004 | Hunter | |
| 6,707,545 B1 | 3/2004 | Hunter | |
| 6,710,868 B2 | 3/2004 | Guetta | |
| 6,721,045 B1 | 4/2004 | Hunter | |
| 6,818,064 B2 | 11/2004 | Baker | |
| 6,849,563 B2 | 2/2005 | Barth et al. | |
| 6,869,640 B2 | 3/2005 | Yoshihara et al. | |
| 6,913,781 B2 | 7/2005 | Kaneyama et al. | |
| 6,982,002 B2 | 1/2006 | Tanaka et al. | |
| 7,012,684 B1 | 3/2006 | Hunter | |
| 7,485,188 B2 | 2/2009 | Takekuma et al. | |
| 7,497,026 B2 | 3/2009 | Herchen | |
| 7,659,973 B2 | 2/2010 | Furman | |
| 7,670,643 B2 | 3/2010 | Winter | |
| 8,254,657 B2 * | 8/2012 | Pollack | G06T 7/0002 382/128 |
| 9,555,436 B2 | 1/2017 | Uemae et al. | |
| 9,709,510 B2 | 7/2017 | Kolchin | |
| 10,109,508 B2 * | 10/2018 | Ashidate | H01L 21/31144 |
| 10,665,481 B2 | 5/2020 | Sano et al. | |
| 2002/0176928 A1 | 11/2002 | Minami et al. | |
| 2003/0008066 A1 | 1/2003 | Yoshihara et al. | |
| 2003/0218741 A1 | 11/2003 | Guetta | |
| 2004/0072450 A1 | 4/2004 | Collins et al. | |
| 2005/0263066 A1 | 12/2005 | Lubomirsky et al. | |
| 2006/0262295 A1 | 11/2006 | Backhauss et al. | |
| 2007/0251450 A1 | 11/2007 | Lin | |
| 2007/0290047 A1 | 12/2007 | Tazaki et al. | |
| 2008/0143828 A1 * | 6/2008 | Mandrachia | G01N 21/8507 348/82 |
| 2008/0144025 A1 | 6/2008 | Vollrath et al. | |
| 2010/0091284 A1 | 4/2010 | Mieher et al. | |
| 2013/0010296 A1 | 1/2013 | Kwak et al. | |
| 2013/0312788 A1 | 11/2013 | Kubo et al. | |
| 2014/0045281 A1 | 2/2014 | Aiura et al. | |
| 2015/0029517 A1 | 1/2015 | Park et al. | |
| 2015/0197861 A1 | 7/2015 | Tice et al. | |
| 2015/0219499 A1 | 8/2015 | Waldmann et al. | |
| 2015/0246175 A1 * | 9/2015 | Shubinsky | A61M 5/16831 604/131 |
| 2015/0346609 A1 | 12/2015 | Den Boeff | |
| 2015/0362367 A1 | 12/2015 | Seo et al. | |
| 2016/0327777 A1 | 11/2016 | Rowlette et al. | |
| 2017/0309501 A1 * | 10/2017 | Kitamura | H01L 21/67086 |
| 2018/0082862 A1 * | 3/2018 | Ashidate | H01L 21/31111 |
| 2018/0128676 A1 | 5/2018 | Katzlinger et al. | |
| 2018/0233383 A1 * | 8/2018 | Ashidate | H01L 21/31111 |
| 2018/0233384 A1 * | 8/2018 | Nagai | H01L 21/67086 |
| 2018/0323085 A1 | 11/2018 | Sano et al. | |
| 2019/0103294 A1 * | 4/2019 | Masutomi | H01L 21/67086 |
| 2019/0172737 A1 | 6/2019 | Endo et al. | |
| 2019/0217325 A1 | 7/2019 | deVilliers | |
| 2019/0217326 A1 | 7/2019 | deVilliers | |
| 2019/0287793 A1 | 9/2019 | deVilliers et al. | |
| 2020/0098598 A1 * | 3/2020 | Takahashi | H01L 21/0217 |
| 2020/0194280 A1 * | 6/2020 | Konishi | H01L 21/67173 |
| 2020/0234428 A1 | 7/2020 | George et al. | |
| 2021/0129166 A1 | 5/2021 | Carcasi et al. | |
| 2021/0134637 A1 | 5/2021 | Carcasi et al. | |
| 2021/0150697 A1 | 5/2021 | Estrella et al. | |
| 2022/0068673 A1 * | 3/2022 | Nakaoka | H01L 21/673 |

FOREIGN PATENT DOCUMENTS

| | | | | |
|---|---|---|---|---|
| JP | 2000082646 A | | 3/2000 | |
| JP | 2006049630 A | | 2/2006 | |
| JP | 2006339598 A | * | 12/2006 | |
| JP | 2006339598 A | | 12/2006 | |
| JP | 2009094208 A | | 4/2009 | |
| JP | 2013110270 A | | 6/2013 | |
| JP | 2013247183 A | | 12/2013 | |
| JP | 5431172 B2 | | 3/2014 | |
| JP | 6000743 B2 | | 10/2016 | |
| JP | 6020829 B2 | | 11/2016 | |
| JP | 2017508136 A | | 3/2017 | |
| JP | 2017090232 A | | 5/2017 | |
| JP | 2018046262 A | | 3/2018 | |
| JP | 2019102742 A | | 6/2019 | |
| KR | 200287420 Y1 | | 8/2002 | |
| KR | 100989857 B1 | | 10/2010 | |
| KR | 101107507 B1 | | 1/2012 | |
| KR | 20160112240 A | | 9/2016 | |
| KR | 20170022512 A | | 3/2017 | |
| KR | 101842119 B1 | | 3/2018 | |
| KR | 101977771 B1 | | 5/2019 | |
| WO | 229390 W | | 4/2002 | |
| WO | 2015195746 A1 | | 12/2015 | |
| WO | WO-2016084927 A1 | * | 6/2016 | B05C 11/00 |

OTHER PUBLICATIONS

Muraoka, JP-2006339598-A, Machine Translation. (Year: 2022).*

FLIR Systems Lepton series LWIR camera specification sheet Mar. 2021, 2 pages.

FLIR, Technical Note, "R&D and industrial applications for Near Infrared (NIR) cameras," Publicly Available at least as of Apr. 1, 2021, 4 pages.

M. Barth, S. Parthasarathy, Jing Wang, E. Hu, S. Hackwood and G. Beni, "A color vision system for microelectronics: Application to oxide thickness measurements," Proceedings. 1986 IEEE International Conference on Robotics and Automation, San Francisco, CA, USA, 1986, pp. 1242-1247.

PCT International Search Report and Written Opinion, PCT Application No. PCT/US2022/027865, dated Sep. 1, 2022, 11 pages.

* cited by examiner

BATH SYSTEMS AND METHODS THEREOF

TECHNICAL FIELD

The present invention relates generally to a system and method for monitoring bath processes, and, in embodiments, to bath systems and methods thereof.

BACKGROUND

Wafer bath chambers with circulating fluids are commonly used in semiconductor manufacturing to perform substrate surface preparation steps such as surface cleaning, resist strip, and the etching of thin films simultaneously on batches of multiple wafers.

Across wafer and wafer-to-wafer uniformity are critical for providing integrated circuit components such as transistors, capacitors, and resistors with a narrow electrical distribution across all wafers in a lot. Achieving across wafer and wafer-to-wafer uniformity in bath chambers is a challenge for large diameter wafers such as 12-inch wafers.

Insufficient cleaning or etching of substrates in a surface preparation bath can result in reduced yield due to resist or thin film residues left on the wafers or from non-uniformity in an etched thin film remaining on the wafers. Excessive cleaning increases cycle time and generates excessive hazardous waste. Excessive cleaning can also reduce yield when over etch causes a thin film thickness or critical dimension to be off target.

SUMMARY

In an embodiment, a method of processing a plurality of substrates includes immersing the plurality of substrates into a bath solution contained in a bath chamber; generating gas bubbles in the bath solution; projecting light from a light source toward the bath chamber; generating light sensor data by capturing light emanating off the bath chamber after interacting with the gas bubbles with a light sensor; and converting the light sensor data into a metric for the bath solution.

In an embodiment, a bath processing tool includes a bath chamber with a loading arm and configured to hold a bath solution; a light source mounted on a source mounting assembly for projecting light toward the bath chamber; and a light sensor mounted on a sensor mounting assembly for capturing light emanating from the bath chamber after interaction with the gas bubbles in the bath solution.

In an embodiment, a bath processing tool includes a bath chamber for wet processing wafers; an electromagnetic radiation sensor to capture an electromagnetic signal from a bath solution in the bath chamber; a processor; and a non-transitory memory storing a program and coupled to the processor, the program to be executed in the processor and including instructions to: determine a metric of the bath solution based on the electromagnetic signal, and identify that a target specification for processing the wafer is reached based on the metric of the bath solution.

In an embodiment, an endpoint detection method includes processing a wafer in a wet process; capturing, at an electromagnetic radiation sensor, an electromagnetic signal from a bath solution in a bath chamber during the processing; based on the electromagnetic signal, determining an endpoint metric of the bath solution; and based on the endpoint metric of the bath solution, stopping the wet process in response to identifying that an endpoint for the processing is reached.

In an embodiment, a process control method including: processing a wafer in a wet process; capturing, at an electromagnetic radiation sensor, an electromagnetic signal from a bath solution in a bath chamber during the processing; based on the electromagnetic signal, determining a process target specification of the bath solution; and based on the process target specification of the bath solution, adjusting the bath solution in response to determining the process target specification.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

Embodiments of this application disclose systems and methods for monitoring bath processes with gas bubbles. Embodiments of this application disclose methods of monitoring mixing uniformity and surface preparation process uniformity across bath chambers. Embodiments of this application disclose methods of accurately determining the endpoint of processes in a surface preparation bath.

Figure 1A:
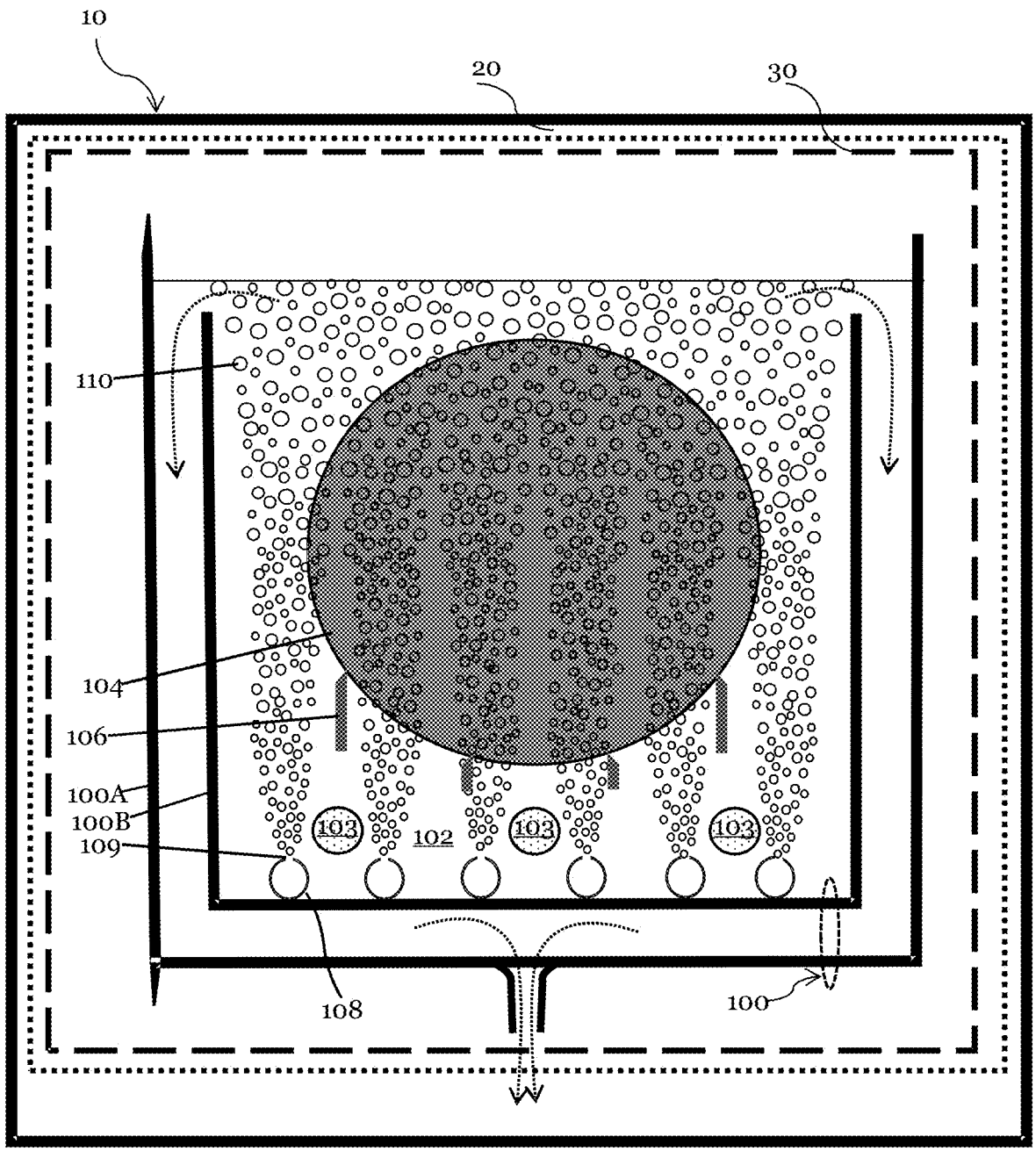
FIG. 1A is a cross sectional view of a bath chamber with fluid injectors and gas injectors and FIG. 1B is a cross sectional view of a bath chamber with fluid injectors and heating elements in accordance with embodiments.
Figure 1B:
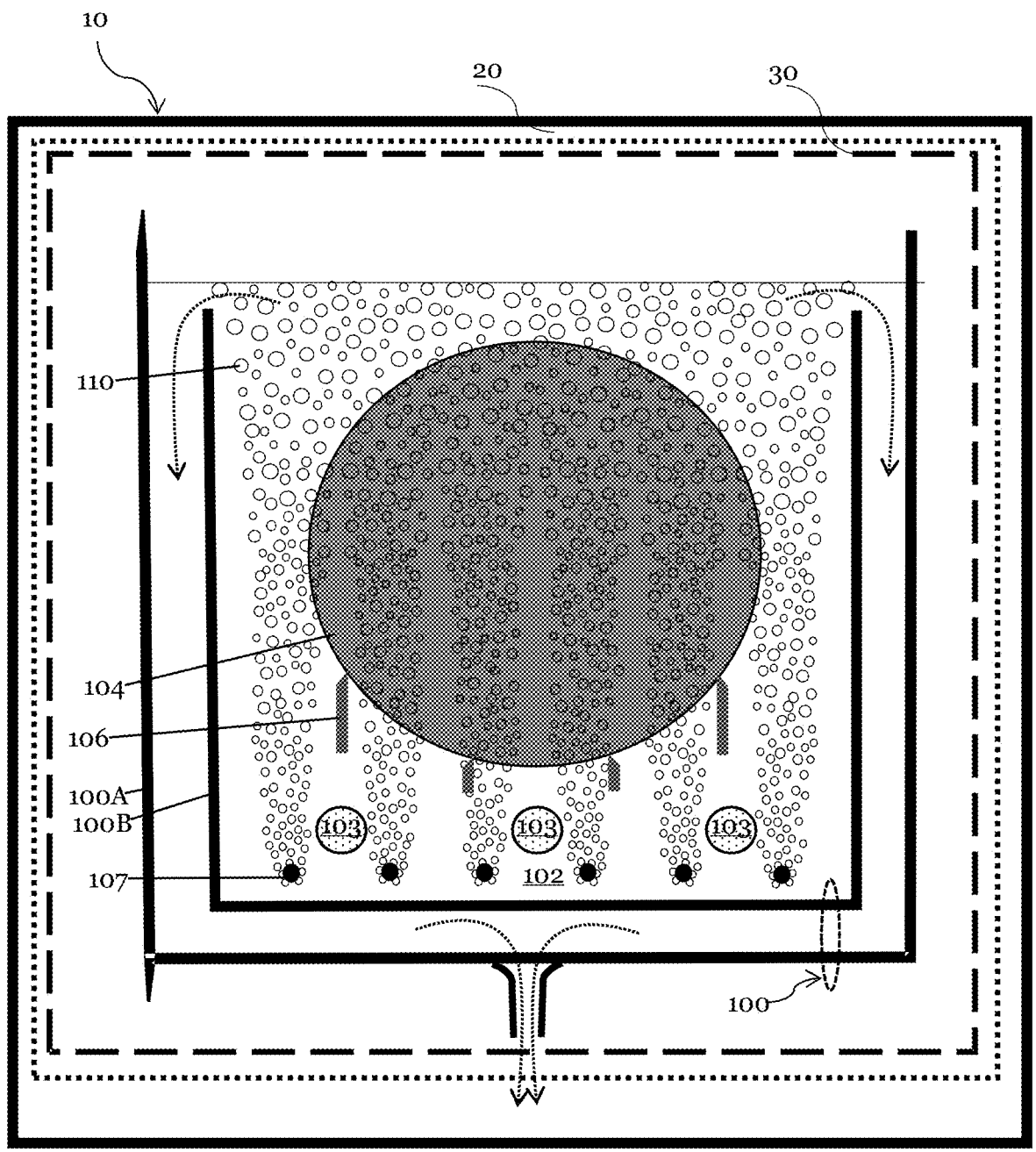

A cross sectional view of a bath tool 10 comprising a bath chamber for a surface preparation bath 100 for processing multiple wafers 104 is illustrated in FIG. 1A and FIG. 1B.

In FIG. 1A the surface preparation bath 100 includes an outer bath chamber 100A and an inner bath chamber 100B. The outer bath chamber 100A and inner bath chamber 100B are typically Pyrex or quartz. Bath solution 102 flows into the bath 100 from fluid injectors 103 near the bottom of the bath 100. The bath solution 102 fills the inner bath chamber 100B and overflows into the outer bath chamber 100A. Wafers 104 are lowered into the bath solution 102 and are supported in the bath 100 chamber on wafer loading arms 106. In FIG. 1A, gas bubbles 110 (usually nitrogen) are injected into the bath solution 102 from orifices 109 along the length of gas injectors 108 near the bottom of the bath 100. The gas bubbles 110 rise through the bath solution 102 faster than the bath solution 102 flows into the bath 100 providing vigorous mixing. Gas bubbles 110 continuously replenish bath solution 102 on the surface of the wafers 104.

In FIG. 1B, gas bubbles 110 are generated in the bath solution 102 by heating elements 107 which locally heat the bath solution 102 around the heating elements 107 to boiling near the bottom of the bath 100. The localized boiling of the bath solution 102 causes the formation of the gas bubbles around the heating elements 107. Accordingly, in various embodiments, the bath tool 10 comprises a bubble injector comprising heating elements 107 and/or gas injectors 108 for generating gas bubbles (110) in the bath solution positioned below the loading arm. For purposes of illustration, heating elements are shown in this arrangement but other arrangements and other types of heating elements 107 can be used.

The heat which causes the bath solution 102 to boil can also be produced by an exothermic reaction between reactants within the bath solution 102. For example, the temperature of a piranha bath (sulfuric acid plus hydrogen peroxide) can be controlled with the rate at which hydrogen peroxide is added to the sulfuric acid. For example, the boiling temperature of a hot phosphoric acid/water bath used for stripping silicon nitride can be controlled by keeping the ratio of phosphoric acid to water in the bath 100 constant.

As further illustrated in FIGS. 1A and 1B, the bath tool 10 includes a light mounting assembly 20 designed to be customized to shine light in selected regions of the bath 100 as well as select a particular type of light. In addition, the light mounting assembly 20 may be designed to direct light at different angles of incidence into the inner and outer bath chambers 100A and 100B. The light mounting assembly 20 may include the mechanical system, circuitry, controller, and one or more light sources. The bath tool 10 includes a sensor mounting assembly 30 to detect the light scattered from the bath solution 102. The sensor mounting assembly 30 may include one or more light sensors mounted on a mechanical system and designed to detect light scattered from one or more regions of the bath solution 102. Various embodiments of the light mounting assembly 20 and the sensor mounting assembly 30 will be further described in detail below.

Figure 2:
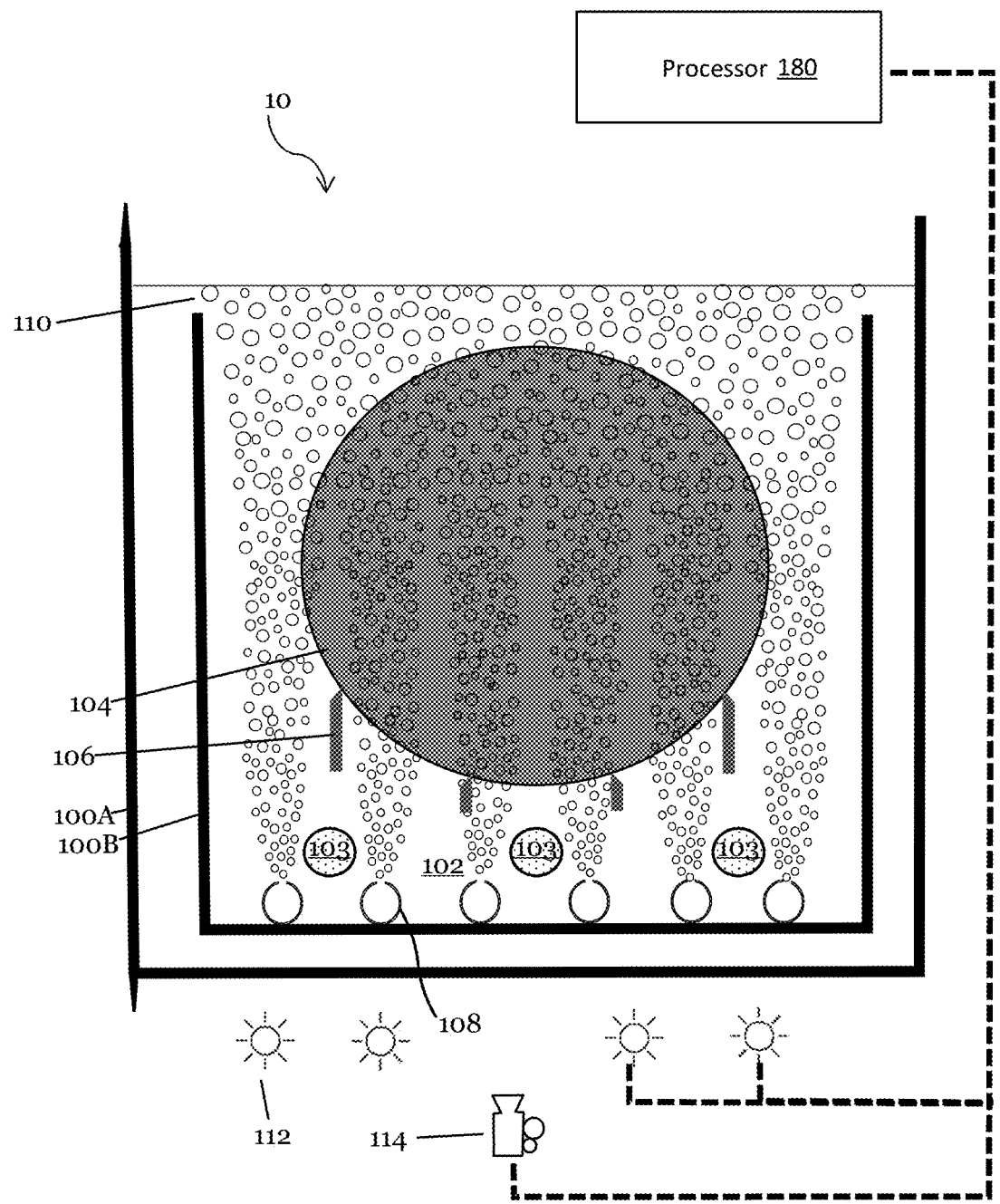
FIG. 2 is a cross sectional view of a system for monitoring and controlling a bath with gas bubble mixing in accordance with an embodiment.

A system for monitoring mixing uniformity and uniformity of the bath solution 102 across the bath, by capturing and analyzing light scattered from gas bubbles 110, is illustrated in FIG. 2.

Light sources 112 project light into the bath 100. Multiple light sources 112 can project light into multiple zones across the length and width of the bath 100. Light scattered from gas bubbles 110 can be captured by a light sensor 114 or by multiple light sensors 114. The amount of light scattered from gas bubbles 110 in a first zone in the bath 100 can be compared with the amount of light scattered from gas bubbles in a second zone to determine zone to zone uniformity across the bath 100. Various bubble properties indicative of bath solution 102 conditions and uniformity can be calculated from light sensor data. Various bubble properties include static bubble count density and size density, dynamic bubble count density and size density, static bubble uniformity, dynamic bubble uniformity, bath solution uniformity, and bubble generation rate.

In FIG. 2, light sources 112 and light sensor 114 are positioned below the bath 100, e.g., mounted on the light mounting assembly 20 and the sensor mounting assembly 30 respectively. The light sources 112 can be LEDs or lasers. The light sensor 114 can be a charge-coupled device (CCD) camera with an array of CCD pixels, a complementary metal oxide semiconductor (CMOS) image sensor with an array of CMOS pixels, or the light sensor 114 can be a photo diode or an array of photo diode pixels. The light sensor 114 can send light data to a processor 180 for analysis. The processor 180 may be the controller for the bath tool 10 or a common controller for a group of tools. The processor 180 can increase or decrease the gas flow from the gas injectors 108 to improve mixing uniformity across the inner bath chamber 100B. The processor 180 can increase or decrease the amount of fluid being injected into the bath 100 from the fluid injectors 103. The processor 180 can also adjust intensity of the light sources 112, can turn the light sources 112 off and on, and can synchronize the light sources 112 with the light sensor 114. The processor 180 can increase or decrease the power to heating elements 107 to increase or decrease boiling. The processor 180 can adjust the flows of components causing the exothermic reactions so as to control the temperature of the bath 100. For example, increasing the reaction rate of an exothermic reaction can cause in a local heating within the bath 100 resulting in the boiling of the bath solution 102, which causes an increase in increased formation of gas bubbles, which could be detected.

Figure 3:
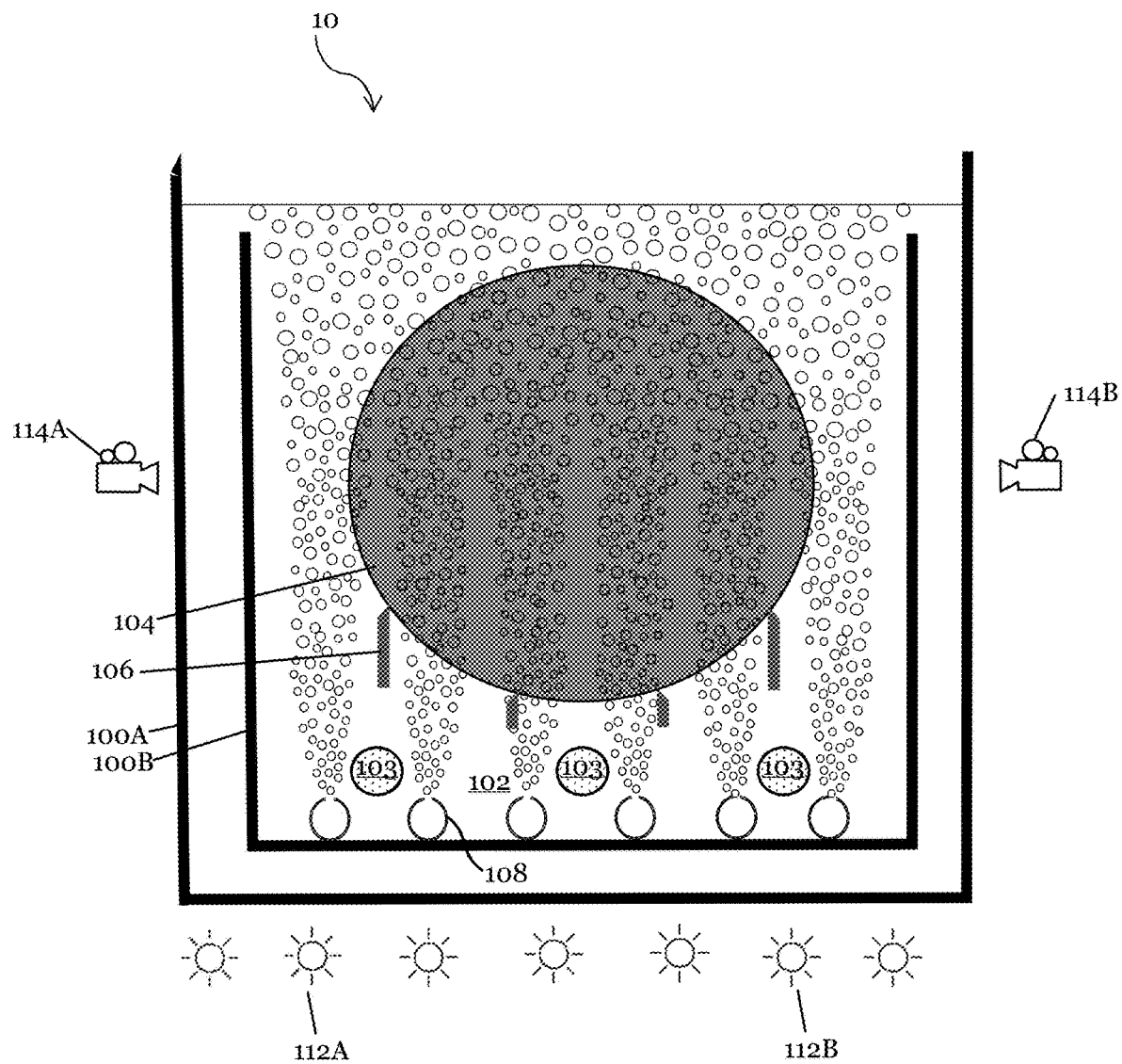
FIG. 3 is a cross sectional view of a system for monitoring and controlling a bath with gas bubble mixing in accordance with an embodiment.

FIG. 3 illustrates an alternative embodiment in which the light sensors 114, located at an angle from light path from the light sources 112 into the bath, capture the scattered light.

As illustrated, in various embodiments, the light sources 112 in FIG. 3 are distributed, e.g., uniformly, across the underside of the bath 100. Light sensors 114 directed toward the sides of the bath 100 chamber capture light scattered horizontally from gas bubbles 110 out of the sides of the bath 100 chamber. In one embodiment, the light sensors 114 are located orthogonal to the path of light from the light sources 112 into the bath 100. In other embodiments, the light sensors 114 may be located at other locations to capture light that is scattered at different angles from the bath 100. In one embodiment, while the light is shining from the light sources 112, the light sensors 114 may be scanned in a horizontal or vertical direction, e.g., from the bottom of the bath 100 to the top of the bath 100, to obtain a video or a series of images. The obtained video or the series of images may then be analyzed together to determine the various bubble parameters, which can then be used to improve bath uniformity and other process metrics.

In various embodiments, the light sources 112 can have different wavelengths (colors). The differently colored light sources 112 can illuminate different zones in the bath 100. The light sensors 114 can be a CCD camera, a CMOS image sensor, or a photo diode array with color filters to separate the differently colored light. This method can eliminate intensity errors that occur when light from more than one light source 112 scatters off the same gas bubble 110. A bubble property from two adjacent zones can be compared without interference using this method.

The light sources 112 can be cycled on and off synchronously with a light sensor 114 or with light sensors 114. The frequency, duty cycle, and power of the light sources 112 can be varied to produce flashes of light similar to strobe lights. A flash of light enables the light sensor 114 to capture a clear static image of gas bubbles 110. Static bubble patterns can be analyzed to compare bubble size in various bath zones, to determine across zone and zone-to-zone bubble uniformity and bubble density. A series of static bubble patterns can be taken over time and analyzed to determine changes in zone bubble uniformity and bubble density. By alternatingly flashing a first light source 112 and a second adjacent light source 112, the uniformity of the bath solution 102 in two adjacent bath zones can be determined without interference.

As an illustration, in the arrangement shown in FIG. 3, mixing uniformity in corresponding zones on the left and right halves of wafers 104 can be analyzed by comparing the light scattered from gas bubbles 110 in a first zone on the left half of the wafer with light scattered from gas bubbles 110 in a second zone of the right half of the wafer. In the arrangement in FIG. 3, light from a first light source 112A under the first zone is scattered horizontally off gas bubbles into a first light sensor 114A directed at the left side of the bath 100. Light from a second light source 112B under the second zone is scattered horizontally off gas bubbles into second light sensor 114B directed at the right side of the bath 100.

Figure 4:
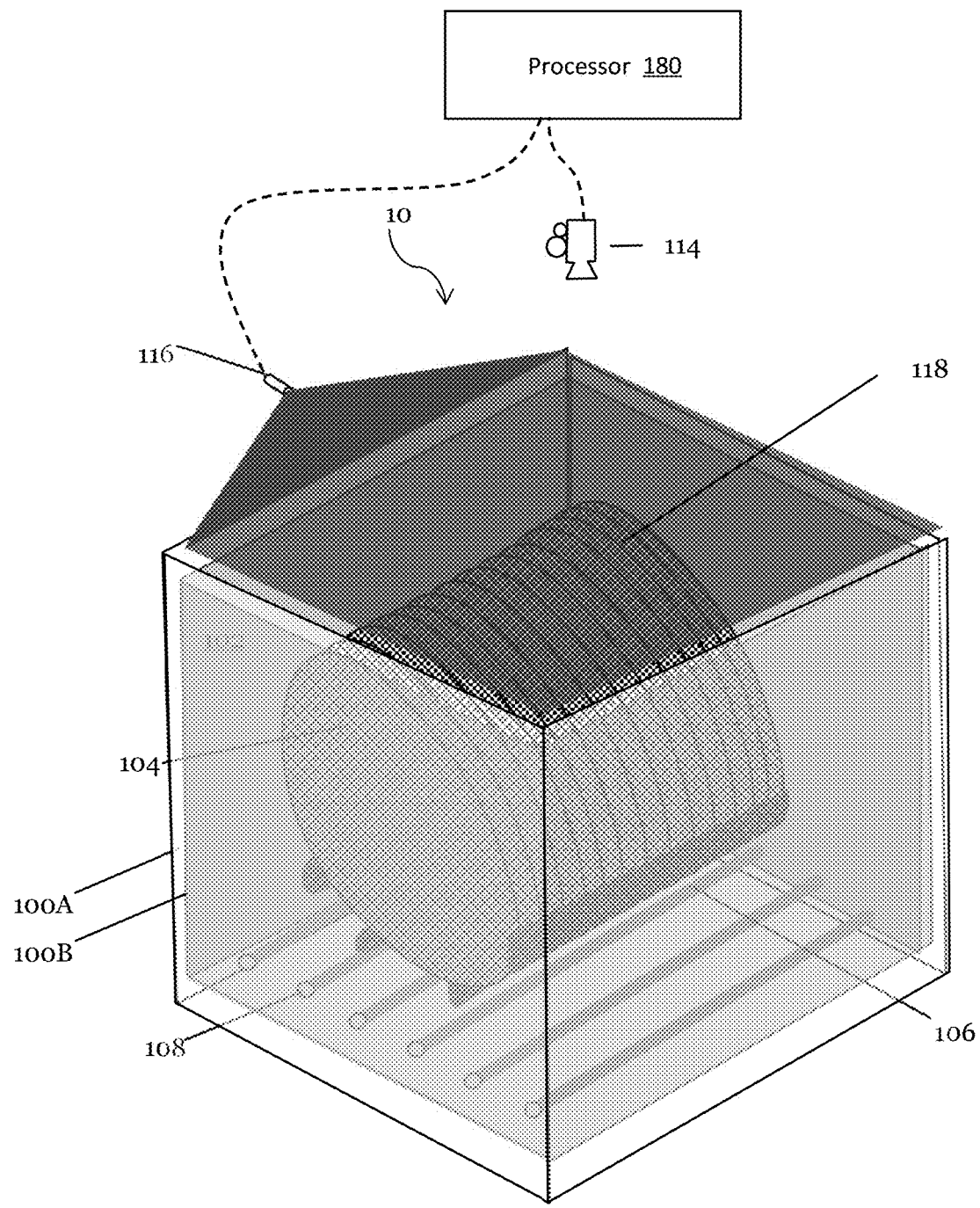
FIG. 4 is a projection view of a system for monitoring and controlling a bath with gas bubble mixing in accordance with an embodiment.
Figure 5:
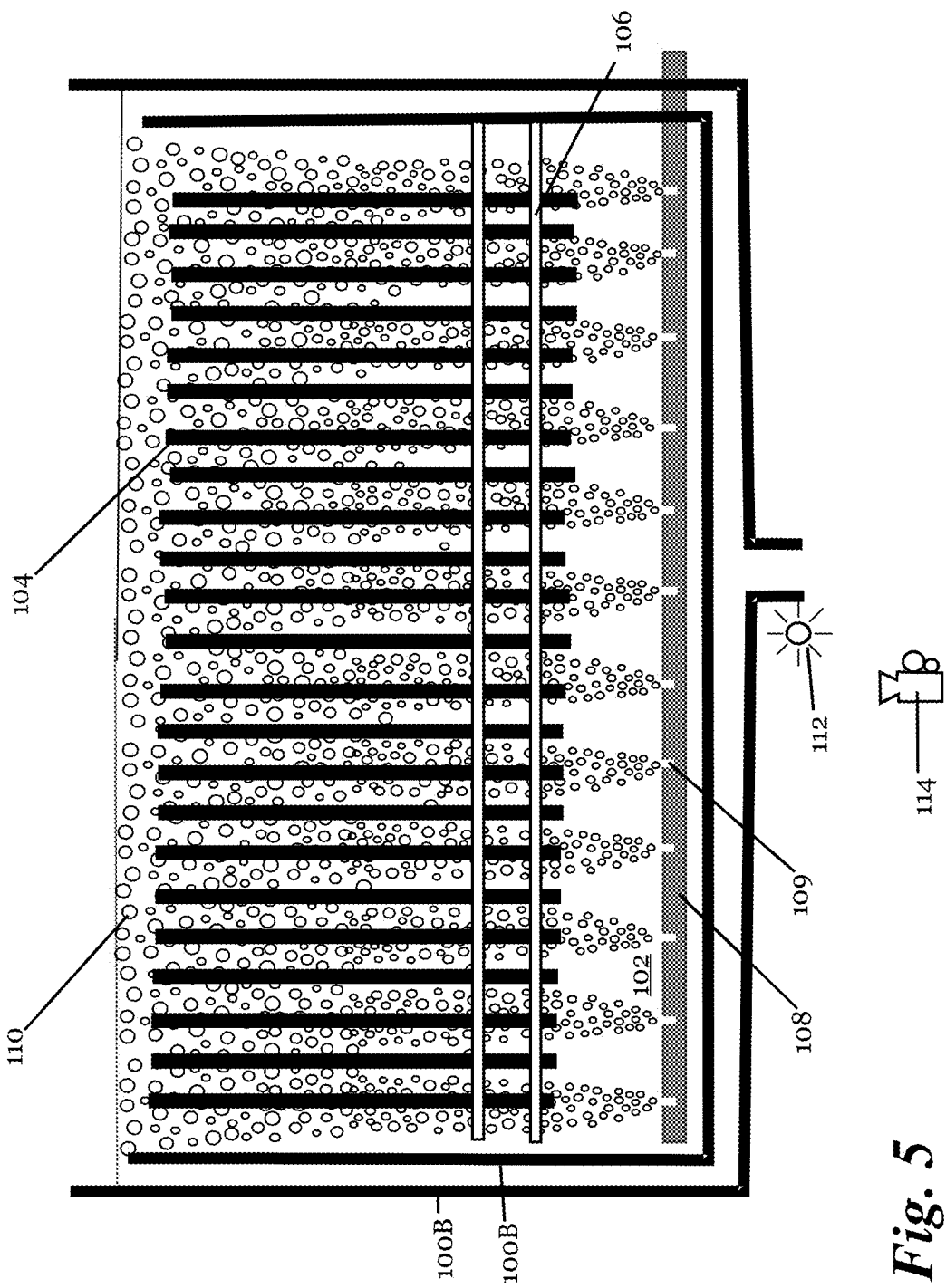
FIG. 5 is a cross sectional view of a system for monitoring and controlling a bath with gas bubble mixing in accordance with an embodiment.

FIG. 4 illustrates a projection view of a bath tool in accordance with an embodiment. The bath tool in FIG. 4 illustrates an arrangement for analyzing and monitoring mixing uniformity in the bath solution 102 by capturing light reflected from droplets ejected into the air above the surface of the bath 100 as gas bubbles 110 rise to the surface and burst. A laser 116 can sweep a beam of laser light above the surface of the bath solution 102 forming a plane of laser light 118 (over time). Laser light that scatters from droplets ejected from the bursting bubbles can be captured by a light sensor 114 above the plane of laser light 118. The light sensor 114 can be a CCD camera or a photo diode camera. The intensity and uniformity of the light captured by the individual pixels 152 (FIG. 11) in a CCD or photodiode pixel array 150 can be analyzed to determine the uniformity and rate of gas bubbles 110 bursting across the surface of the bath solution 102. The processor 180 can increase or decrease the rate of gas injection from the gas injectors 108 to increase or decrease mixing and can balance the gas bubbles 110 being ejected from individual gas injectors 108 to improve across bath 100 mixing uniformity. Alternatively, the processor 180 can increase or decrease the power to the heating elements 107 to increase or decrease mixing and can balance the gas bubbles 110 being formed around individual heating elements 107 to improve across bath 100 mixing uniformity. The processor 180 can adjust the flows of components in exothermic reactions to control the temperature and therefore the boiling of the bath 100. FIG. 5 illustrates a cross-sectional view of a bath tool in accordance with an embodiment.

In FIGS. 2 and 3, the light source 112 is positioned to monitor bath mixing uniformity across a width of the bath 100 chamber. The light source 112 illuminates multiple bath zones across the major surface of the wafers.

In another embodiment illustrated in FIG. 5, light source 112 is positioned to monitor bath mixing uniformity across a length of the bath 100 chamber. The light source 112 illuminates multiple bath zones along the length of a gas injector 108 or multiple zones along the length of a heating element 107. The light source 112 illuminates a corresponding surface area on all the wafers 104 in the batch. Gas bubbles 110 are ejected from orifices 109 along the length of a gas injector 108 or from the hot surface along the length of the heating element 107. The wafers 104 in the batch are lined up along the gas injector 108 and are spaced apart above the gas injector 108 on wafer loading arms 106. In FIG. 5, the light sensor 114 is below the bath 100 chamber. The light sensor 114 captures light reflected off bubbles rising between the wafers 104. Alternatively, the light sensor 114 can be positioned to capture light being scattered out the sides of the bath 100 chamber as shown in FIG. 3.

Figure 6:
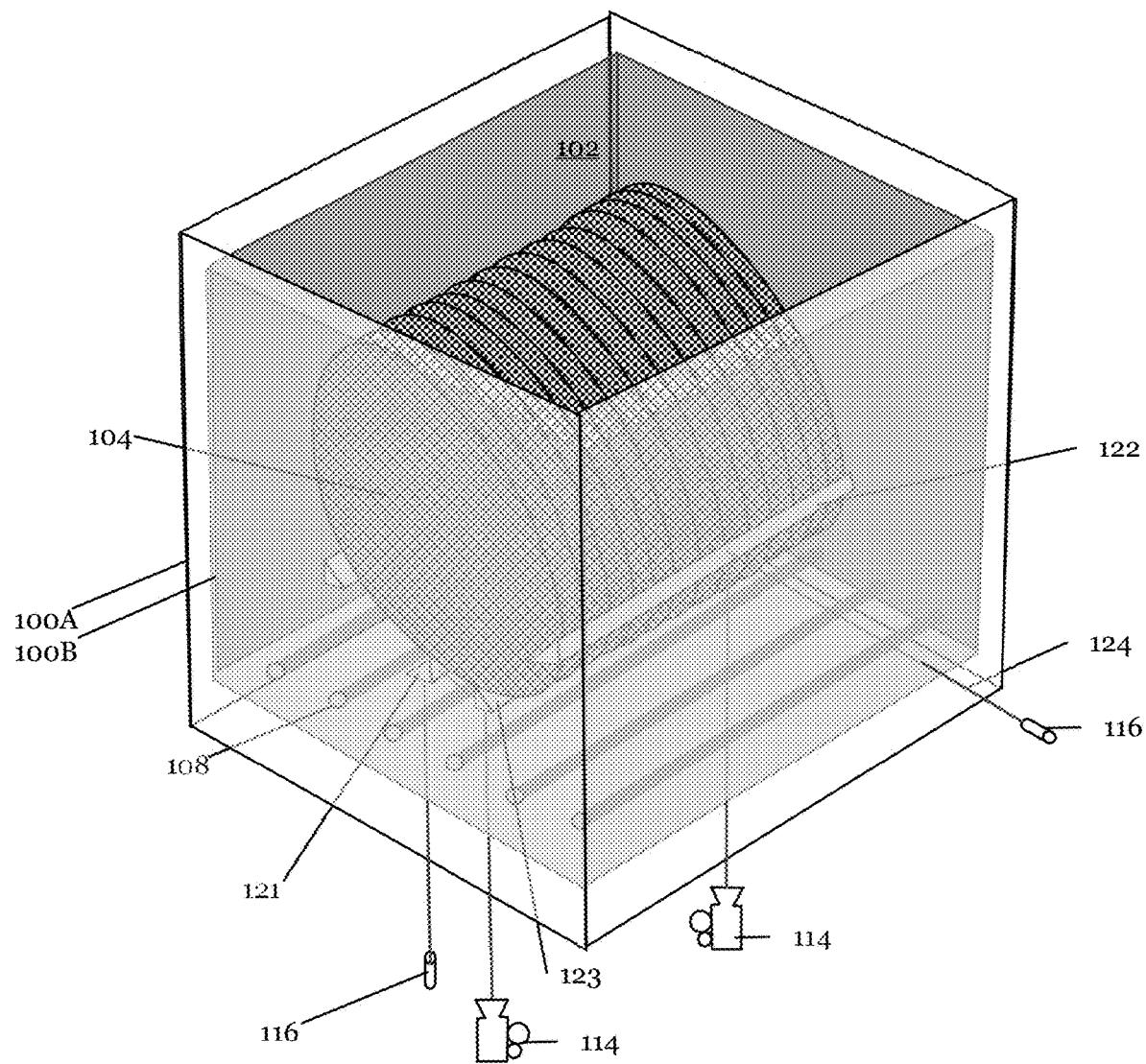
FIG. 6 is a projection view of a system for monitoring and controlling a bath with gas bubble mixing in accordance with an embodiment.

FIG. 6 illustrates a projection view of a bath tool in accordance with an embodiment.

In the arrangement illustrated in FIG. 6, a laser beam 124 is projected into the bath and redirected toward a light sensor 114 by a prism 122. The prism 122 can be located at any convenient location within the bath 100. In FIG. 5, prisms 122 perform a double duty for light refraction and as wafer loading arms 106.

In a first example, a laser 116 projects a laser beam 124 horizontally into a side of the bath 100 towards prism 122. Prism 122 redirects the light 90 degrees downward toward a light sensor 114 below the bath 100. As the laser beam 124 travels through the bath solution 102, light from the laser beam 124 is scattered off the gas bubbles 110 decreasing the intensity of the laser beam 124. The decrease in intensity of the laser beam 124 can be correlated to a bubble property such as bubble density, bubble uniformity, and bubble generation rate. Alternatively, the laser 116 can be above or below the bath and the light sensor 114 alongside the bath 100.

In a second example, a laser 116 projects a laser beam 124 vertically from below the bath 100 towards a first prism 121 in the bath 100. The first prism 121 redirects the laser beam 124 90 degrees horizontally toward a second prism 123. The second prism 123 redirects the laser beam 124 90 degrees downward toward the light sensor 114 below the bath 100. As the laser beam 124 travels through the bath solution 102, light from the laser beam 124 is scattered off the gas bubbles 110 decreasing intensity of the laser beam. The intensity can be converted to a bubble property such as bubble uniformity, bubble density, and bubble generation rate. Alternatively, by repositioning the first prism 121 and second prism 123, the laser 116, and light sensor 114 can be positioned alongside the bath 100.

Figure 7:
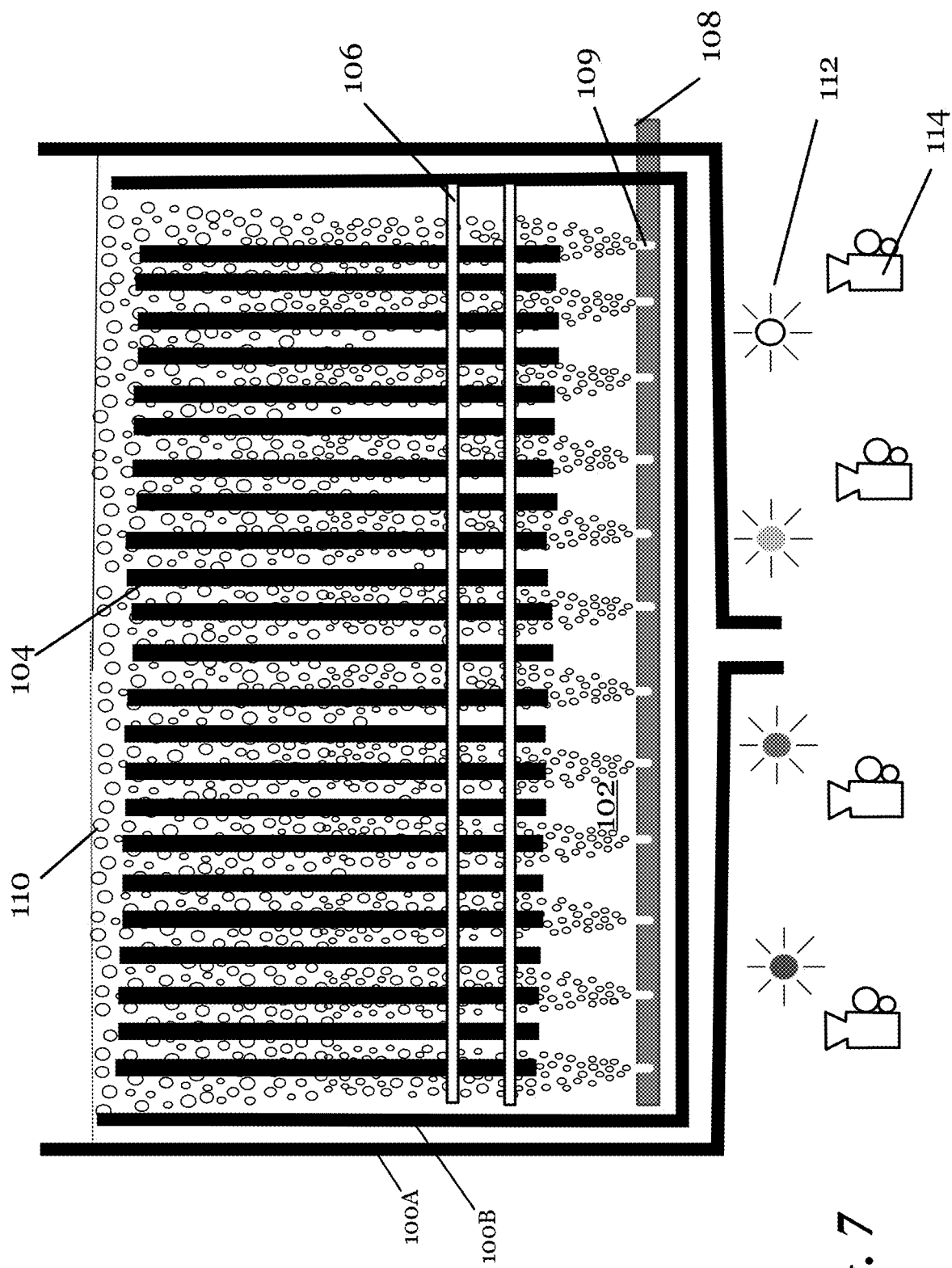
FIG. 7 is a cross sectional view of a system for monitoring and controlling a bath with gas bubble mixing in accordance with an embodiment.

FIG. 7 is a cross sectional view of a length of a surface preparation bath 100 filled with a bath solution 102.

Wafers 104 supported by wafer loading arms 106 are orientated vertically and are spaced apart horizontally above the gas injectors 108. Gas bubbles 110 are ejected from orifices 109 spaced along the length of the gas injectors 108. In this arrangement, a plurality of light sources 112 are positioned below the bath 100 and spaced along the length of the bath 100. A plurality of light sensors 114 are also positioned below the bath 100 and along the length of the bath 100. If desired, each of the plurality of light sensors 114 can be configured to sense light from the respective one of the plurality of light sources 112.

Figure 8:
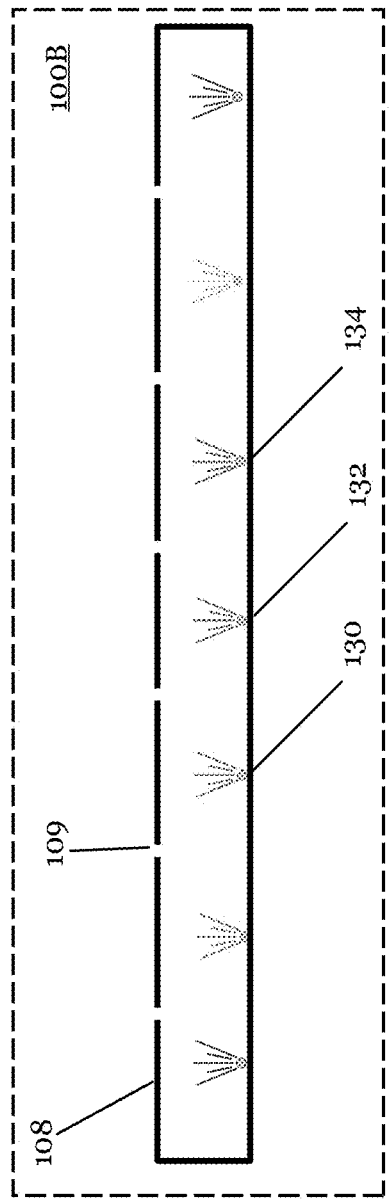
FIG. 8 is a cross sectional view of a light source for a bath with light sources integrated into a gas injector in accordance with an embodiment.

FIG. 8 illustrates an embodiment in which the gas injector within the bath 100 chamber includes the light source 112. As illustrated in FIG. 8, in or more embodiments, the gas injector 108 comprises the light source 112. In one embodiment, multiple LEDs or lasers may be integrated into the gas injector 108. In this arrangement, the light sources 112 are affixed to the bottom inside surface of a gas injector 108, e.g., made of quartz. Other arrangements are possible in alternate embodiments. For example, the light sources 112 can be positioned at other locations within the gas injector 108 or can be placed outside the gas injector 108 and protected from the bath solution 102 in an integrated gas injector 108/light source 112 module.

Figure 9:
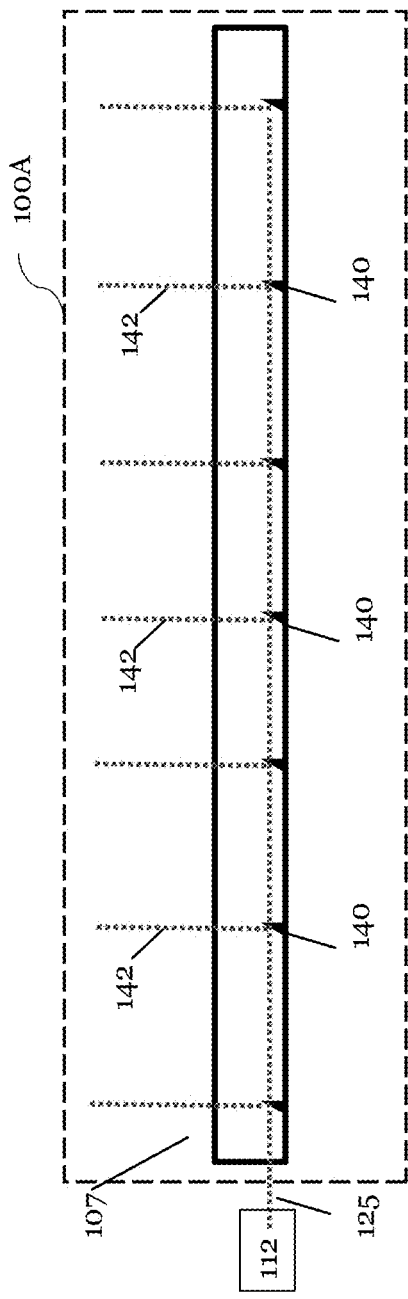
FIG. 9 is a cross sectional view of a light source comprising a light pipe with internal reflectors to illuminate multiple zones in a bath in accordance with an embodiment.

FIG. 9 illustrates an embodiment in which the bath tool is illuminated with a single light source.

Referring to FIG. 9, one light source 112 is configured to illuminate multiple zones in the bath 100. A light beam 125, which may be a laser beam, is projected into a light pipe 107 made of a transparent material such as Pyrex or quartz. Spaced along the inside of the light pipe 107 are reflective surfaces 140 which redirect multiple portions 142 of the light beam 125 into multiple zones in the bath 100. The light pipe 107 may be designed to be placed within the bath 100 while the light source 112 may be placed outside the bath 100.

Figure 10:
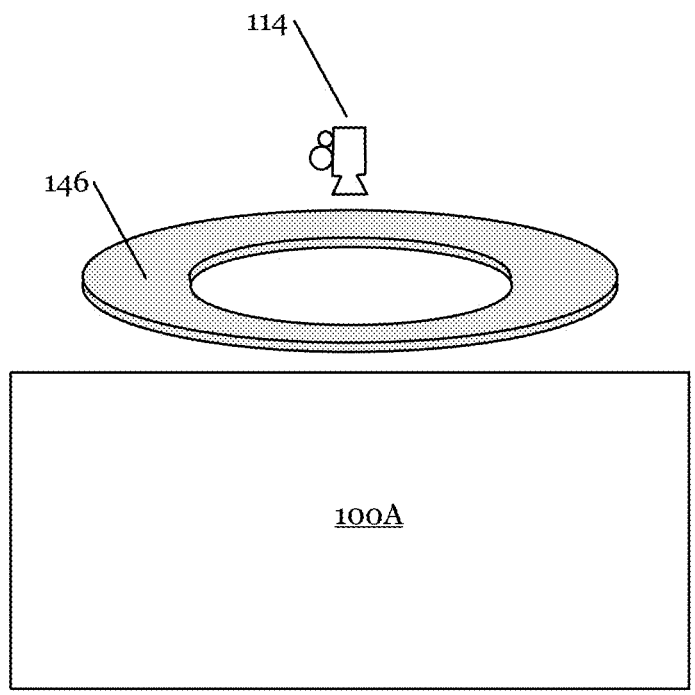
FIG. 10 is a projection view of a light source for a bath comprising a circular illuminator in accordance with an embodiment.

FIG. 10 illustrates an embodiment in which the bath tool is illuminated with a light source placed around a light sensor.

Referring to FIG. 10 a donut shaped light source 146 illuminates the bath 100. In an embodiment, the donut shaped light source 146 is shaped like a ring. The donut shaped light source 146 can be positioned either above or below the bath 100. The donut shaped light source 146 can uniformly illuminate the bath 100 when positioned around a light sensor 114, which may be located at the center of the donut shaped light source 146.

Figure 11:
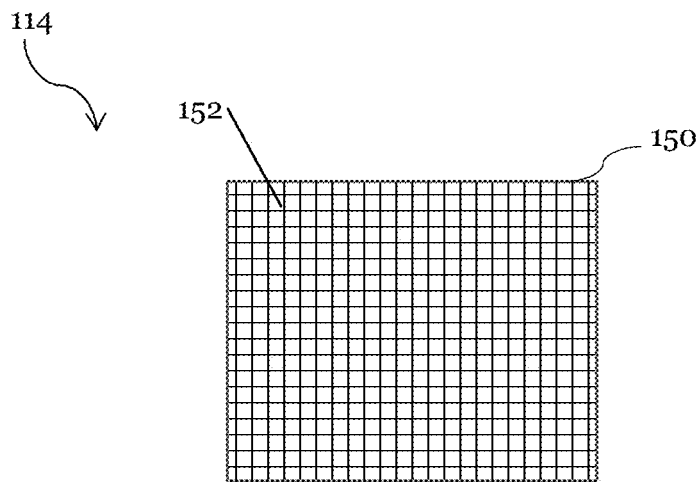
FIG. 11 is a light sensor comprising a rectangular array of pixels in accordance with an embodiment.
Figure 12:
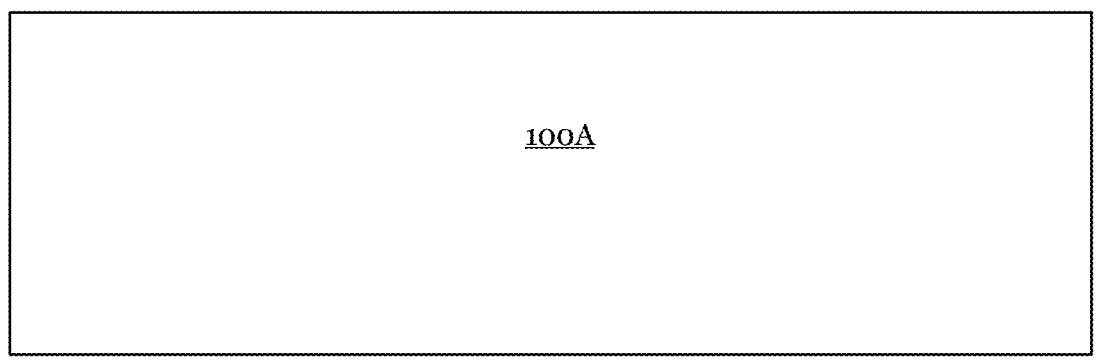
FIG. 12 is a light sensor comprising a strip of pixels in accordance with an embodiment.
Figure 12:
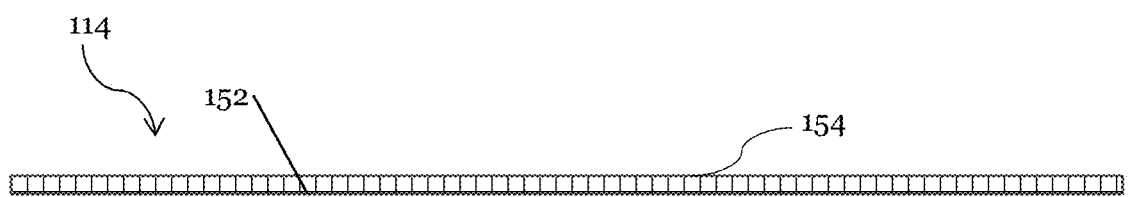

Illustrative light sensor 114 arrangements are shown in FIGS. 11 and 12.

FIG. 11 illustrates a top view of an array 150 of pixels 152 such as charge coupled device (CCD) pixels, CMOS sensor pixels, or photo diode pixels. Such a pixel array 150 can be in a CCD camera, a CMOS sensor camera or a photo diode camera. These light sensor 114 arrangements can be used to capture a two-dimensional image of the bath 100. Pixels 152 from two different locations in the image can be analyzed to compare uniformity at two different zones in the bath 100.

FIG. 12 illustrates a side view of light sensor 114 having a rectangular strip 154 of pixels 152. This type of light sensor 114 can be positioned adjacent to the bath 100 to capture light along the length of a gas injector 108. This arrangement can be used to monitor the rate of gas bubbles 110 being ejected from orifices 109 along the gas injector 108 and determine if any orifice 109 has become enlarged or clogged. The rectangular strip 154 of pixels 152 may be composed of elements of charge-coupled device (CCD) image sensor, photo diode image sensor, or CMOS array sensor.

Figure 13:
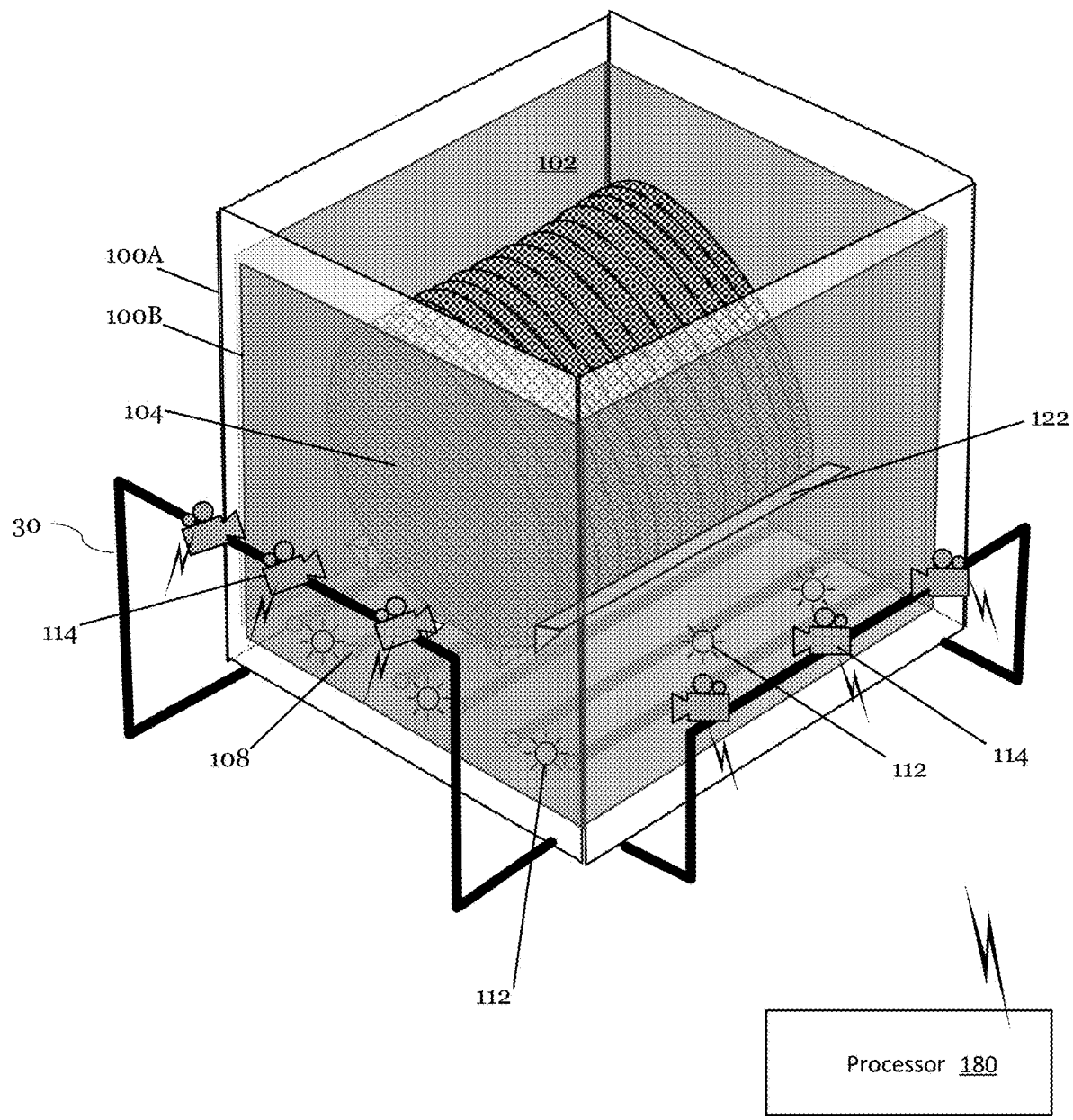
FIG. 13 is a projection view of a system for monitoring and controlling a bath with gas bubble mixing in accordance with an embodiment.

FIG. 13 illustrates an arrangement where light sources 112 are positioned uniformly across the bottom of the bath 100 and light sensors 114 are positioned along the length and width on the sides of the bath 100. A different number of light sources 112 and light sensors 114 can be used than are shown in the illustration.

The light source 112 can be LEDs or lasers. The LEDs or lasers can all be the same color or can be different colors. The light source 112 can be continuous or can be flashed on and off with a duty cycle that is synchronous with the light sensor 114. Data from the light sensor 114 can be communicated to a processor 180 and converted to information regarding bath conditions such as mixing and uniformity by executing a program in the processor 180 as known to an ordinary person skilled in the art. The processor 180 can adjust gas injection rate to increase or decrease mixing. The processor 180 can adjust gas injection from individual gas injectors 108 to improve mixing uniformity. Alternatively, the processor 180 can adjust the power to heating elements 107 to increase or decrease mixing and can also locally adjust power to individual heating elements 107 to improve mixing uniformity. The processor 180 can adjust the flow of components in exothermic reactions to control the temperature and therefore boiling of the bath 100. The processor 180 can also adjust the rate at which bath solution 102 is injected into the bath through the fluid injectors 103.

Figure 14:
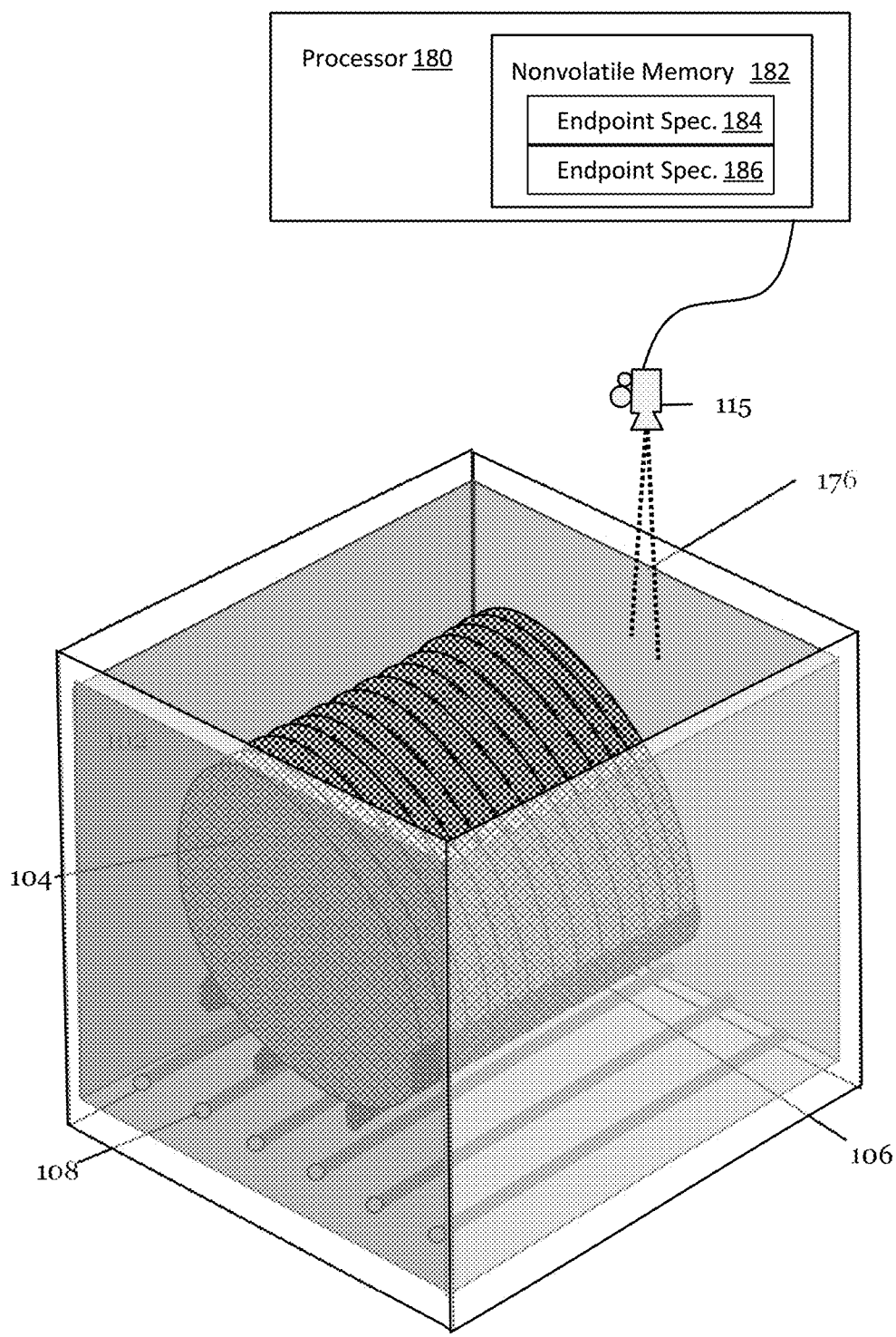
FIG. 14 is a projection view of a system for determining an endpoint of and controlling processes in a bath in accordance with an embodiment.

A system and method for controlling a process variable and for determining the endpoint of a surface preparation process in a bath 100 is illustrated in FIG. 14.

An electromagnetic radiation sensor 115 captures electromagnetic radiation 176 emanating from the bath 100—electromagnetic radiation such as long wavelength infrared radiation that measures temperature; visible light that measures properties such as color, transparency, and turbidity; and short wavelength infrared (IR) radiation that can determine the concentration of various components in a fluid mixture from the intensity of IR absorption peaks in the infrared (IR) spectrum of the fluid mixture.

Data from the electromagnetic radiation sensor 115 such as a CCD sensor, a photodiode sensor, or a microbolometer can be transmitted to a processor 180. The processor 180 can analyze the data and compare it to first endpoint specification 184 and second endpoint specification 186 stored in a nonvolatile memory 182. When sensor data matches the first endpoint specification 184, the processor can adjust the process or can terminate the process. For example, if the surface preparation process is a resist strip, when the electromagnetic radiation sensor 115 no longer detects resist molecules in the stripping solution, the wafers 104 can be removed from the stripping bath and transferred into a rinse bath. If the wet batch process is etching a thin film, when bath temperature or bath color indicates the etching is complete, the processor can terminate the etching process and initiate a transfer of the wafers 104 to a rinse tank. If the process is preparation of an etching solution, the processor 180 can compare bath temperature to the first endpoint specification 184 if the mixing is exothermic or can compare concentration of the components in the etching solution as determined from the IR spectrum to the second endpoint specification 186. When the endpoint specification is met, the processor 180 can then terminate the solution preparation step and initiate lowering the wafers 104 into the bath 100.

The processor 180 can also analyze the data and compare it to a process variable target specification stored in the nonvolatile memory 182. The processor can then make adjustments to the surface preparation process to keep the process variable on target. For example, during a silicon nitride stripping process the processor 180 can add water as needed to the hot phosphoric acid/water mixture to keep the boiling temperature on target.

The electromagnetic radiation sensor 115 used for endpoint determination can be a short wavelength infrared (IR) detector that includes a spectrometer. The spectrometer can sweep over a range of wavelengths and measure the intensity of the IR light at each wavelength. The concentration of organic molecules in a solution can be determined from the intensity of absorption peaks in their characteristic IR spectrum. The IR spectrum of a fluid mixture can be compared to the first and second endpoint specifications 184 and 186, stored in nonvolatile memory 182 to determine if the current surface preparation processing step should be adjusted or terminated.

Figures 15A, 16A:
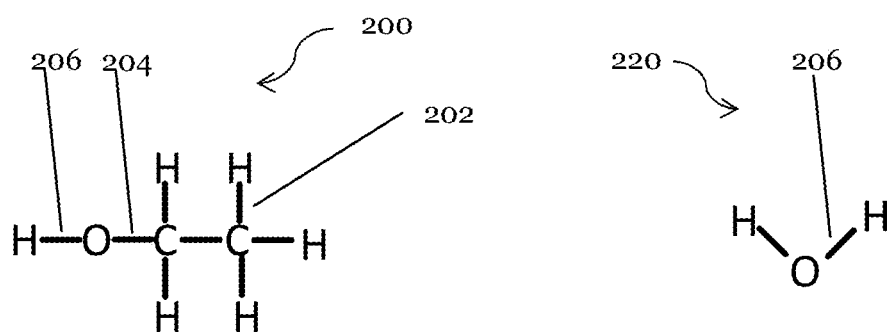
FIGS. 15A and 15B show an ethanol molecule and the infrared spectrum of the ethanol molecule in accordance with an embodiment.
FIGS. 16A and 16B show a water molecule and the infrared spectrum of the water molecule in accordance with an embodiment.
Figure 15B:
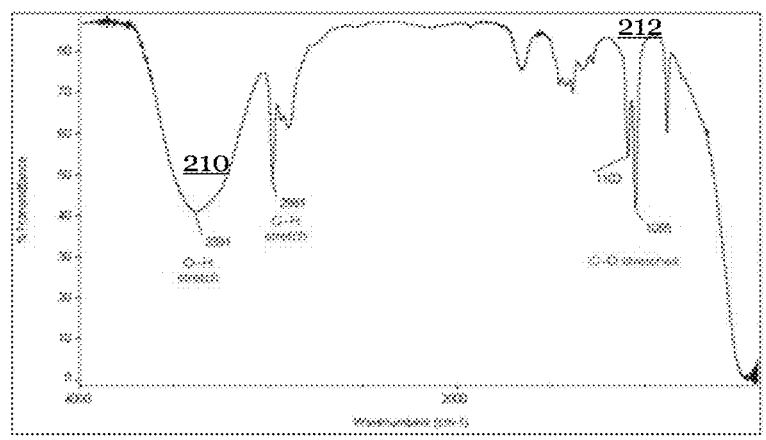
Figure 16B:
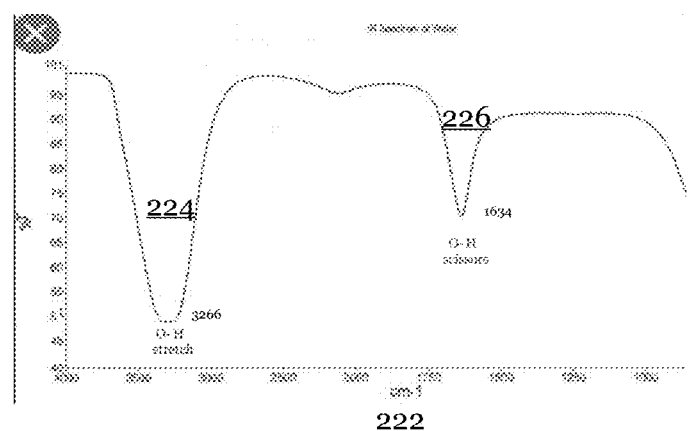

FIGS. 15B and 16B schematically illustrate IR spectra of ethanol and water, respectively. FIGS. 15A and 16A depict the ethanol molecule and the water molecule. The unit of wavelength used in IR spectroscopy is the reciprocal of the wavelength in units of reciprocal centimeters ($cm^{-1}$) or wavenumber. In FIG. 15B as the wavenumber is swept from 4000 to 900 $cm^{-1}$ along the x-axis, the percent transmission of the IR light is recorded on the y-axis. At 3391 cm-1, illustrated by the trough 210, the IR transmission drops to about 40% as the O—H bond in ethanol stretches and absorbs IR energy. At 1055 $cm^{-1}$, illustrated by the trough 212, the IR transmission drops to about 45% as the C—O bond in ethanol stretches and absorbs IR energy. The percent transmission at these wavenumbers depends upon the concentration of ethanol in the mixture.

FIG. 16B is the IR spectrum of water. At 3266 cm-1, illustrated by the trough 224, the IR transmission drops to about 45% as the O—H bond in water stretches and absorbs IR energy. At 1634 $cm^{-1}$, illustrated by the trough 226, the IR transmission drops to about 70% as the scissor motion of the O—H bonds in water adsorbs IR energy.

The spectrum of a fluid mixture in a bath 100 can be taken by using a spectrometer to scan the wavelengths with the electromagnetic radiation sensor 115. The processor 180 can then compare the IR spectrum of the fluid mixture to a reference second endpoint specification 186, which may be a spectrum, stored in memory 182 and can initiate a change to the process when the spectra match. For example, when a fluid mixture of ethanol 200 and water 220 is being prepared, a spectrum of the fluid mixture can be taken repeatedly and compared to a reference second endpoint specification 186 stored in memory 182. When the IR spectrum of the mixture matches the reference second endpoint specification 186, the desired ratio of ethanol to water is achieved. The ratio of ethanol to water can also be monitored throughout the process and the processor 180 can recommend to add more water or ethanol as needed to keep the composition on target.

Figure 17:
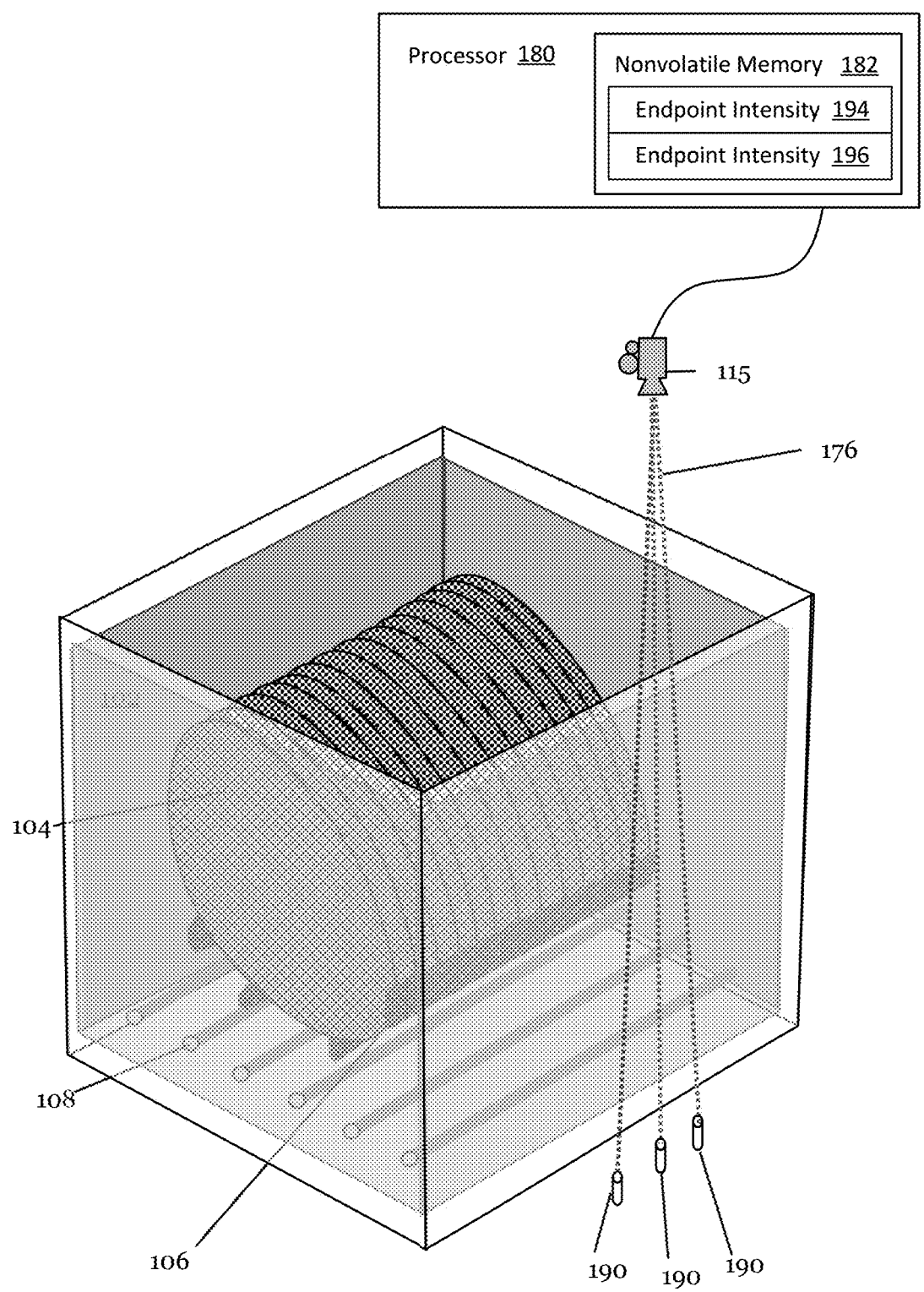
FIG. 17 is a projection view of a system for determining an endpoint of and controlling processes in a bath in accordance with an embodiment.

FIG. 17 illustrates an alternative apparatus and method for determining the concentrations of components in a bath solution 102 using short wavelength IR spectra. Instead of using a spectrometer, IR sources 190 with wavelengths at absorption peaks which uniquely identify the fluid components can be projected through the bath solution 102 mixture and captured by a electromagnetic radiation sensor 115 sensitive to these wavelengths. Filters can be added to enable independent measurement of transmission at the two wavelengths. Alternatively, the IR sources 190 can be flashed on and off synchronous with the electromagnetic radiation sensor 115 to independently measure transmission at the different wavelengths. This apparatus and method are less costly than a spectrometer.

For example, in a mixture including ethanol 200 and water 220, the broad absorption peak (trough) 210 for ethanol at 3391 $cm^{-1}$ and broad absorption peak (trough) 224 at 3266 $cm^{-1}$ for water interfere with each other and therefore cannot be used. In an ethanol/water mixture, absorption peak (trough) 212 at 1055 $cm^{-1}$ is unique for ethanol and absorption peak (trough) 226 at 1634 $cm^{-1}$ is unique for water. The intensity of the transmitted radiation from two IR sources 190 with these two wavelengths can be captured by a electromagnetic radiation sensor 115 and compared by the processor 180 to reference first and second endpoint intensities 194 and 196 stored in memory 182. When the electromagnetic radiation sensor 115 data match the reference first endpoint intensity 194, the desired ratio of ethanol and water has been achieved. This example is for illustrative purposes only. Other fluid mixtures with components that have unique IR absorption peaks at other wavelengths can be used as well.

Example embodiments of the invention are summarized here. Other embodiments can also be understood from the entirety of the specification as well as the claims filed herein. Reference numerals are added below for illustration purposes only and the various examples could be implemented differently and are not to be construed as being limited to only these illustrations.

Example 1. A method of processing a plurality of substrates includes immersing the plurality of substrates into a bath solution (102) contained in a bath (100) chamber; generating gas bubbles (110) in the bath solution (102); projecting light from a light source (112) toward the bath chamber; generating light sensor data by capturing light emanating off the bath chamber after interacting with the gas bubbles (110) with a light sensor (114); and converting the light sensor data into a metric for the bath solution.

Example 2. The method of example 1, where generating the gas bubbles (110) includes injecting the gas bubbles (110) through a gas injector (108) or boiling the bath solution.

Example 3. The method of one of examples 1 or 2, where the metric for the bath solution includes a static bubble size and count density, a dynamic bubble size and count density, a static bubble uniformity, a dynamic bubble uniformity, a bath solution uniformity, or a bubble generation rate.

Example 4. The method of one of examples 1 to 3, where projecting the light from the light source (112) toward the bath chamber includes illuminating multiple zones of the bath solution with multiple light sources spaced across an outer dimension of the bath chamber; where generating light sensor (114) data by capturing light emanating off the gas bubbles (110) includes capturing light emanating from a first zone of the multiple zones with a first light sensor (114A) of the light sensor (114); capturing light emanating from a second zone of the multiple zones with a second light sensor (114B) of the light sensor (114); and where converting the light sensor data into the metric for the bath solution includes comparing a bubble property in the first zone with a bubble property in the second zone based on the light sensor data.

Example 5. The method of one of examples 1 to 4, where the outer dimension of the bath chamber is parallel to a major surface of the plurality of substrates, where the first zone includes a first portion of the major surface of the plurality of substrates, and where the second zone includes a second portion of the major surface of the plurality of substrates.

Example 6. The method of one of examples 1 to 4, where the outer dimension of the bath chamber is perpendicular to a major surface of the plurality of substrates, where the first zone includes a first portion of a gas injector (108) with a first orifice, and where the second zone includes a second portion of the gas injector (108) with a second orifice.

Example 7. The method of one of examples 1 to 6, where illuminating multiple zones of the bath solution with multiple light sources includes illuminating the first zone with a first light of a first wavelength and illuminating the second zone with a second light of a second wavelength, the second wavelength being different from the first wavelength, and where capturing light further includes using a first filter to capture light of the first wavelength and using a second filter to capture light of the second wavelength.

Example 8. The method of one of examples 1 to 6, where the multiple light sources include lights configured to periodically turn on and off at a duty cycle, and where illuminating the multiple zones includes flashing the first zone at a first frequency synchronous with the first light sensor and flashing the second zone at a second frequency synchronous with the second light sensor.

Example 9. The method of one of examples 1 to 6, where projecting the light from the light source (112) towards the bath chamber includes forming a plane of laser (116) light above a surface of the bath solution; where generating light sensor data further includes capturing light emanating off droplets produced by the gas bubbles (110) bursting at the surface of the bath solution; and where the metric for the bath solution includes a bubble bursting uniformity across the surface of the bath solution or a bubble bursting rate at the surface of the bath solution.

Example 10. The method of one of examples 1 to 6, 9, where projecting the light from the light source toward bath chamber includes redirecting the light with a prism bar (122).

Example 11. A bath processing tool (10) includes a bath chamber with a loading arm and configured to hold a bath solution (102); a light source (112) mounted on a source mounting assembly for projecting light toward the bath chamber; and a light sensor (114) mounted on a sensor mounting assembly (30) for capturing light emanating from the bath chamber after interaction with gas bubbles (110) generated in the bath solution (102).

Example 12. The bath processing tool of example 11, further comprising a gas injector (108) with orifices (109) for releasing the gas bubbles (110) positioned below the loading arm, or a heating element (107) that causes boiling of the bath solution, or inlets (103/108) for flow of reactants into the bath solution, the inlets being configurable to cause boiling of the bath solution.

Example 13. The bath processing tool of one of examples 11 or 12, where the light source (112) includes a quartz gas injector with integrated light emitting diodes (LEDs), a quartz gas injector rod configured to redirect light into multiple zones of the bath chamber, a quartz loader arm with integrated LEDs, a quartz loader arm configured to redirect light into multiple zones of the bath chamber, or a ring illuminator that surrounds a light sensor.

Example 14. The bath processing tool of one of examples 11 to 13, where the light source (112) includes a plurality of light sources spaced across an outer dimension of the bath chamber to illuminate different zones of the bath solution; and where the light sensor (114) includes a plurality of light sensors configured to sense light from the plurality of light sources.

Example 15. The bath processing tool of one of examples 11 to 14, where the light source (112) includes a plurality of light sources having different wavelengths.

Example 16. The bath processing tool of one of examples 11 to 13, where the light source (112) includes a laser (116) configured to generate a plane of laser light above a surface of a bath solution in the bath chamber, and the light sensor (114) includes a charge-coupled device (CCD) image sensor or CMOS array sensor located above the plane of laser light and configured to capture light emanating from bubbles breaking on the surface of the bath solution.

Example 17. The bath processing tool of one of examples 11 to 13, where the light source (112) includes a first prism bar configured to redirect the light toward the light sensor or configured to redirect the light toward a second prism bar configured to redirect the light toward the light sensor.

Example 18. A bath processing tool includes a bath chamber for wet processing wafers (104); an electromagnetic radiation sensor to capture an electromagnetic signal from a bath solution in the bath chamber; a processor (180); and a non-transitory memory (182) storing a program and coupled to the processor (180), the program to be executed in the processor and including instructions to: determine a metric of the bath solution based on the electromagnetic signal, and identify that a target specification for processing the wafer is reached based on the metric of the bath solution.

Example 19. The bath processing tool of example 18, where the metric is an endpoint metric and the processor is configured to terminate the process.

Example 20. The bath processing tool of one of examples 18 or 19, where the metric is a process target specification and the processor is configured to make adjustments to a gas flow, make adjustments to a power to a heating element, or make adjustments to the flow of a bath solution component to keep the bath at the process target specification.

Example 21. The bath processing tool of one of examples 18 to 20, where the electromagnetic radiation sensor includes a long wavelength infrared camera, or a visible light camera, where the instructions to determine the endpoint metric of the bath solution include further instructions to: determine a temperature of the bath solution with the long wavelength infrared camera, or determine a color of the bath solution with the visible light camera.

Example 22. The bath processing tool of one of examples 18 to 20, where the electromagnetic radiation sensor includes a short wavelength camera or a short wavelength camera with a tunable wavelength filter, where the instructions to determine the endpoint metric of the bath solution include further instructions to: determine a concentration of a component in the bath solution with the short wavelength camera, or determine a spectrum of a component in the bath solution with the short wavelength camera with the tunable wavelength filter.

Example 23. The bath processing tool of one of examples 18 to 22, further includes a electromagnetic radiation source configured to generate the electromagnetic signal, the electromagnetic radiation source including multiple electromagnetic radiation sources, each of the multiple electromagnetic radiation sources having a different short infrared wavelength configured to project the short infrared wavelengths through the bath solution; and where the electromagnetic radiation sensor is configured to capture the short infrared wavelengths transmitted through the bath solution, the endpoint metric of the bath solution includes a spectrum of a component in the bath solution.

Example 24. An endpoint detection method including: processing a wafer in a wet process; capturing, at an electromagnetic radiation sensor (115), an electromagnetic signal (176) from a bath solution (102) in a bath chamber during the processing; based on the electromagnetic signal, determining an endpoint metric of the bath solution; and based on the endpoint metric of the bath solution, stopping the wet process in response to identifying that an endpoint for the processing is reached.

Example 25. The method of example 24, where determining the endpoint metric of the bath solution includes determining a temperature of the bath solution with a long wavelength infrared camera, determining a color of the bath solution with a visible light camera, determining a concentration of a component in the bath solution with a short wavelength camera, or determining a spectrum of a component in the bath solution with a short wavelength camera with a tunable wavelength filter.

Example 26. A process control method including: processing a wafer in a wet process; capturing, at an electromagnetic radiation sensor (115), an electromagnetic signal (176) from a bath solution (102) in a bath chamber during the processing; based on the electromagnetic signal, determining a process target specification of the bath solution; and based on the process target specification of the bath solution, adjusting the bath solution in response to determining the process target specification.

Example 27. The method of example 26, where adjusting the bath solution includes adjusting a gas flow, adjusting a power to a heating element (107), or adjusting the flow of a bath solution component to keep the bath at the process target specification.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a plurality of substrates, the method comprising:
   immersing the plurality of substrates into a bath solution contained in a bath chamber;
   generating gas bubbles in the bath solution;
   projecting light from a plurality of light sources toward the bath chamber, each of the plurality of substrates extending across multiple zones that are being illuminated with more than one of the plurality of light sources;
   generating light sensor data by capturing light emanating off the bath chamber after interacting with the gas bubbles with a light sensor; and
   converting the light sensor data into a metric for the bath solution, the converting comprising generating across-wafer zone comparison data based on comparing the light emanating off from one of the multiple zones with light emanating off from another one of the multiple zones.

2. The method of claim 1, wherein generating the gas bubbles comprises injecting the gas bubbles through a gas injector or boiling the bath solution.

3. The method of claim 1, wherein the metric for the bath solution comprises a static bubble size and count density, a dynamic bubble size and count density, a static bubble uniformity, a dynamic bubble uniformity, a bath solution uniformity, or a bubble generation rate.

4. The method of claim 1,
   wherein projecting the light from the plurality of light sources toward the bath chamber comprises illuminating the multiple zones of the bath solution with multiple light sources spaced across an outer dimension of the bath chamber;
   wherein generating light sensor data by capturing light emanating off the gas bubbles comprises
      capturing light emanating from a first zone of the multiple zones with a first light sensor of the light sensor; and
      capturing light emanating from a second zone of the multiple zones with a second light sensor of the light sensor; and
   wherein converting the light sensor data into the metric for the bath solution comprises comparing a bubble property in the first zone with a bubble property in the second zone based on the light sensor data.

5. The method of claim 4, wherein the outer dimension of the bath chamber is parallel to a major surface of the plurality of substrates, wherein the first zone includes a first portion of the major surface of the plurality of substrates, and wherein the second zone includes a second portion of the major surface of the plurality of substrates.

6. The method of claim 4, wherein the outer dimension of the bath chamber is perpendicular to a major surface of the plurality of substrates, wherein the first zone includes a first portion of a gas injector with a first orifice, and wherein the second zone includes a second portion of the gas injector with a second orifice.

7. The method of claim 4, wherein illuminating multiple zones of the bath solution with multiple light sources comprises illuminating the first zone with a first light of a first wavelength and illuminating the second zone with a second light of a second wavelength, the second wavelength being different from the first wavelength, and wherein capturing light further comprises using a first filter to capture light of the first wavelength and using a second filter to capture light of the second wavelength.

8. The method of claim 4, wherein the multiple light sources comprise pulsing lights configured to periodically turn on and off at a duty cycle, and wherein illuminating the multiple zones comprises flashing the first zone at a first frequency synchronous with the first light sensor and flashing the second zone at a second frequency synchronous with the second light sensor.

9. The method of claim 1,
   wherein projecting the light from the plurality of light sources towards the bath chamber comprises forming a plane of laser light above a surface of the bath solution;
   wherein generating light sensor data further comprises capturing light emanating off droplets produced by the gas bubbles bursting at the surface of the bath solution; and
   wherein the metric for the bath solution comprises a bubble bursting uniformity across the surface of the bath solution or a bubble bursting rate at the surface of the bath solution.

10. The method of claim 1, wherein projecting the light from the plurality of light sources toward the bath chamber comprises redirecting the light with a prism bar.

11. The method of claim 1, wherein capturing light emanating off the bath chamber comprises scanning the light sensor along a diameter of the plurality of the substrates.

12. The method of claim 1, wherein generating the gas bubbles comprises injecting the gas bubbles through a plurality of gas injectors oriented along a first direction, wherein each of the plurality of gas injectors comprise a plurality of orifices with openings pointed along a second direction orthogonal to the first direction, and wherein light beams from the plurality of light sources are directed along the second direction.

13. A method of processing a plurality of substrates, the method comprising:
- immersing the plurality of substrates into a bath solution contained in a bath chamber, the bath chamber comprising wafer loading arms extending along a first direction;
- holding the plurality of substrates inside the bath solution with the wafer loading arms, adjacent ones of the plurality of substrates being held along the first direction, each of the plurality of substrates having a diameter along a second direction orthogonal to the first direction;
- generating gas bubbles in the bath solution from a plurality of gas injectors oriented along the first direction;
- projecting light from a plurality of light sources towards the plurality of substrates, the plurality of light sources comprising a first light source emitting light at a first wavelength towards a first zone and a second light source emitting light at a second wavelength towards a second zone, the second wavelength being different from the first wavelength, the first zone and second zone being different volume of the bath solution along the first direction, wherein each of the plurality of gas injectors comprise a plurality of orifices with openings pointed along a third direction orthogonal to the first direction and the second direction, wherein light beams from the plurality of light sources are directed along the third direction;
- generating, at a light sensor, light sensor data based on capturing light emanating off the gas bubbles in the bath solution, wherein capturing light further comprises using a first light sensor and a first filter to capture light of the first wavelength from the first zone and using a second light sensor and a second filter to capture light of the second wavelength from the second zone; and
- converting the light sensor data into a metric for the bath solution.

14. The method of claim 13, wherein the metric for the bath solution comprises a static bubble size and count density, a dynamic bubble size and count density, a static bubble uniformity, a dynamic bubble uniformity, a bath solution uniformity, or a bubble generation rate.

15. A method of processing a plurality of substrates, the method comprising:
- immersing the plurality of substrates into a bath solution contained in a bath chamber, the bath chamber comprising wafer loading arms extending along a first direction;
- holding the plurality of substrates inside the bath solution with the wafer loading arms, adjacent ones of the plurality of substrates being held along the first direction, each of the plurality of substrates having a diameter along a second direction orthogonal to the first direction;
- generating gas bubbles in the bath solution from a plurality of gas injectors oriented along the first direction;
- projecting light from a plurality of light sources towards the plurality of substrates, the plurality of light sources comprising a first light source emitting light at a first wavelength towards a first zone and a second light source emitting light at a second wavelength towards a second zone, the second wavelength being different from the first wavelength, the first zone and second zone being different volume of the bath solution along the first direction;
- generating, at a light sensor, light sensor data based on capturing light emanating off the gas bubbles in the bath solution, wherein capturing light further comprises using a first light sensor and a first filter to capture light of the first wavelength from the first zone and using a second light sensor and a second filter to capture light of the second wavelength from the second zone; and
- converting the light sensor data into a metric for the bath solution, wherein the plurality of light sources are disposed within the plurality of gas injectors, wherein projecting light from a plurality of light sources comprises projecting light of different wavelengths from each of the plurality of gas injectors.

16. The method of claim 13, wherein the plurality of light sources comprise lights configured to periodically turn on and off at a duty cycle, and wherein projecting light from the plurality of light sources comprises flashing the first zone at a first frequency synchronous with the first light sensor and flashing the second zone at a second frequency synchronous with the second light sensor.

17. The method of claim 15, wherein the metric for the bath solution comprises a static bubble size and count density, a dynamic bubble size and count density, a static bubble uniformity, a dynamic bubble uniformity, a bath solution uniformity, or a bubble generation rate.

18. The method of claim 15, wherein the plurality of light sources comprise lights configured to periodically turn on and off at a duty cycle, and wherein projecting light from the plurality of light sources comprises flashing the first zone at a first frequency synchronous with the first light sensor and flashing the second zone at a second frequency synchronous with the second light sensor.

19. The method of claim 15, wherein each of the plurality of gas injectors comprise a plurality of orifices with openings pointed along a third direction orthogonal to the first direction and the second direction, and wherein light beams from the plurality of light sources are directed along the third direction.

* * * * *